United States Patent
Kocaman et al.

(10) Patent No.: US 7,215,171 B2
(45) Date of Patent: May 8, 2007

(54) DIGITALLY CONTROLLED THRESHOLD ADJUSTMENT CIRCUIT

(75) Inventors: Namik Kemal Kocaman, Irvine, CA (US); Afshin Momtaz, Laguna Hills, CA (US)

(73) Assignee: Broadcom Corporation, Santa Clara, CA (US)

( * ) Notice: Subject to any disclaimer, the term of this patent is extended or adjusted under 35 U.S.C. 154(b) by 63 days.

(21) Appl. No.: 11/117,767

(22) Filed: Apr. 28, 2005

(65) Prior Publication Data

US 2006/0244506 A1   Nov. 2, 2006

(51) Int. Cl.
*H03L 5/00* (2006.01)
(52) U.S. Cl. .......................................... 327/307; 330/9
(58) Field of Classification Search ................. None
See application file for complete search history.

(56) References Cited

U.S. PATENT DOCUMENTS

| | | | | |
|---|---|---|---|---|
| 5,267,270 A | * | 11/1993 | Miyashita et al. | .......... 375/318 |
| 6,194,965 B1 | * | 2/2001 | Kruczkowski et al. | ...... 330/258 |
| 6,509,777 B2 | * | 1/2003 | Razavi et al. | ................ 327/307 |

* cited by examiner

*Primary Examiner*—Tuan T. Lam

(57) ABSTRACT

A threshold adjustment circuit including: a current DAC for supplying or sinking a varying current; a differential pair of thin oxide transistors coupled to the DAC and coupled together at a common source node; a power supply for providing a supply voltage having a voltage level above reliability of the thin oxide transistors; and a third transistor for maintaining voltage of the common source node above a predetermined level and to disable the threshold adjustment circuit. The bulk and source of each of the differential pair thin oxide transistors is coupled to the common source node and each of the differential pair thin oxide transistors is switched by a signal to keep each of the differential pair thin oxide transistors in saturation region.

14 Claims, 5 Drawing Sheets

DIGITALLY CONTROLLED THRESHOLD ADJUSTMENT CIRCUIT

FIELD OF THE INVENTION

This application is related to electronic circuits, and more particularly to a digitally controlled threshold adjustment circuit.

BACKGROUND OF THE INVENTION

In optical communications, the transmitted signal over a fiber optic link will exhibit an asymmetric eye opening. For example, as depicted in FIG. 1A, a transmitted signal exhibits an asymmetric eye relative to vertical threshold of its sampler. As known to one skilled in the art, LOGIC 0 has significantly less vertical margin compared to LOGIC 1 due to the shown asymmetry. One way to alleviate the problem is to adjust the Direct Current (DC) component voltage levels of the single-ended signals Outp and Outn in order to level out the vertical margins of Outp and Outn with respect to the sampler. In the example of FIG. 1A, one can decrease the DC component voltage level of Outp, or increase the DC component voltage level of Outn to substantially reduce the asymmetric eye opening. This adjustment of the DC component voltage levels can also be done by both decreasing the DC component voltage level of Outp and increasing the DC component voltage level of Outn simultaneously and in a differential manner for half the amount at each side.

In order to optimize the performance of the receiver to capture the incoming signal with an asymmetric eye opening, it is required to establish a threshold adjustment mechanism that can adjust the vertical eye opening of the signal to a more balanced and symmetric shape. As seen in FIG. 1B, after threshold adjustment, vertical margin of LOGIC 0 is increased and vertical margin of LOGIC 1 is reduced, compared to the same margins in FIG. 1A. Since the minimum margin level determines the receiver performance, it is always desirable to have balanced vertical margins or symmetric eye opening. Threshold adjustment circuits are designed to achieve a more symmetric eye opening in the incoming signals.

FIG. 2 is a conventional threshold adjustment circuit. As depicted in FIG. 2, two current-based Digital to Analog Converters (DACs) are directly connected to Outp and Outn decrease the DC component voltage level of Outp, or increase the DC component voltage level of Outn. However, in this configuration, the DACs' outputs have significant capacitive loading due to large DAC transistors needed to generate the required maximum current for the threshold adjustment. In this case, the DACs heavily load Outp and Outn and thus causing bandwidth limitation. Moreover, two current DACs occupy large silicon area.

In another typical threshold adjustment circuit shown in FIG. 3, two switches Sp and Sn connected to a single current DAC are used to connect the single DAC to Outp or Outn, alternatively. This scheme also suffers from bandwidth limitation due to heavy capacitive loading of Outp and Outn. Switches Sp and Sn can be considered as transistors in triode region when turned ON. In the triode region, Sp and Sn exhibit large drain capacitances, as well as low drain-to-source resistance (Rds). Due to low Rds resistance, majority of the DAC output capacitance will also be observed at Outp and Outn. In a case where low voltage transistors are being used with a supply voltage (VDD) above the reliability voltage limit, Sp and Sn switches may exhibit reliability problems due to over the limit terminal voltages.

All of above conventional implementations introduce bandwidth limitations on the signal path. In addition, the above conventional threshold adjustment circuits require further improvements to avoid any reliability problems if low voltage transistors are used with a power supply voltage above their reliability voltage limit. These circuits also occupy large silicon area.

Therefore, there is a need for an accurate and reliable threshold adjustment circuit that does not impose any significant bandwidth reduction due to loading of the signal path.

SUMMARY OF THE INVENTION

In one embodiment, the present invention is a threshold adjustment circuit including: a current digital-to-analog converter (DAC) for supplying or sinking a varying current; a differential pair of thin oxide transistors coupled to the DAC and coupled together at a common source node; a supply voltage having a voltage level above reliability of the pair of thin oxide transistors; and a third transistor for maintaining voltage of the common source node above a predetermined level and to disable the threshold adjustment circuit, wherein the bulk and source of each of the differential pair thin oxide transistors is coupled to the common source node and each of the differential pair thin oxide transistors is switched by a signal having an ON voltage level so that one of the thin oxide transistors is in saturation region and having an OFF voltage level so that the other thin oxide transistor is OFF but within its reliability limit.

In one embodiment, the present invention is a circuit for threshold adjustment of an input signal having a first and a second component. The threshold adjustment circuit includes: a first differential pair of first and second thin oxide transistors for decreasing a DC voltage component of the first or second component of the input signal; a second differential pair of third and fourth thin oxide transistors for increasing a DC voltage component of the first or the second component of the input signal; a power supply for providing a supply voltage having a voltage level above reliability of the thin oxide transistors, wherein each of the differential pair thin oxide transistors is switched by a signal that keeps each of the first, second, third, and fourth thin oxide transistors in saturation region.

In one embodiment, the present invention is a threshold adjustment circuit for a differential input signal. The threshold adjustment circuit includes: means for decreasing DC voltage component of either side of the differential input signal; means for increasing the DC voltage component of either side of the differential input signal; and means for generating a signal for switching between means for decreasing the DC voltage component and means for increasing the DC voltage component voltage of the input signal.

DETAILED DESCRIPTION

In one embodiment, the present invention is a digitally controlled threshold adjustment circuit which does not impose any significant bandwidth reduction due to loading of the signal path. Since the circuit is digitally controlled, it can easily be incorporated into an adaptive algorithm that can automatically find the optimal point for sampling, without user intervention.

Figure 4:
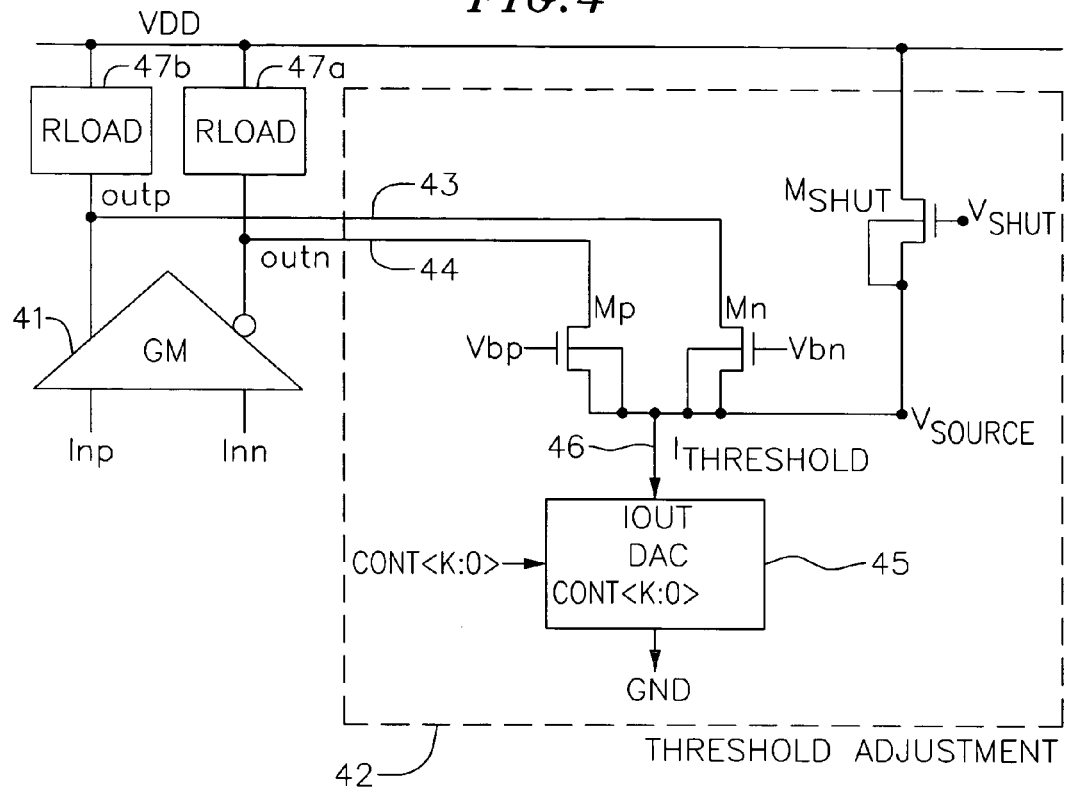
FIG. 4 is an exemplary circuit diagram of a threshold adjuster for decreasing DC component voltages, according to one embodiment of the present invention.

FIG. 4 is an exemplary circuit diagram of a threshold adjuster, according to one embodiment of the present invention. As depicted in FIG. 4, a threshold adjustment circuit 42 is connected to current summing nodes 43 and 44, which generate Outp and Outn, respectively. As an example, threshold adjustment circuit 42 can be connected to Outp and Outn at the output of a gain stage which includes a trans-conductance (GM) 41 sinking current from load impedances ($R_{LOAD}$) 47a and 47b. Threshold adjustment circuit 42 includes a current DAC 45, which generates a threshold current 46 ($I_{threshold}$). In one embodiment, a thermometer coded current steering DAC is utilized to implement the DAC 45, as depicted in FIG. 5.

Figure 5:
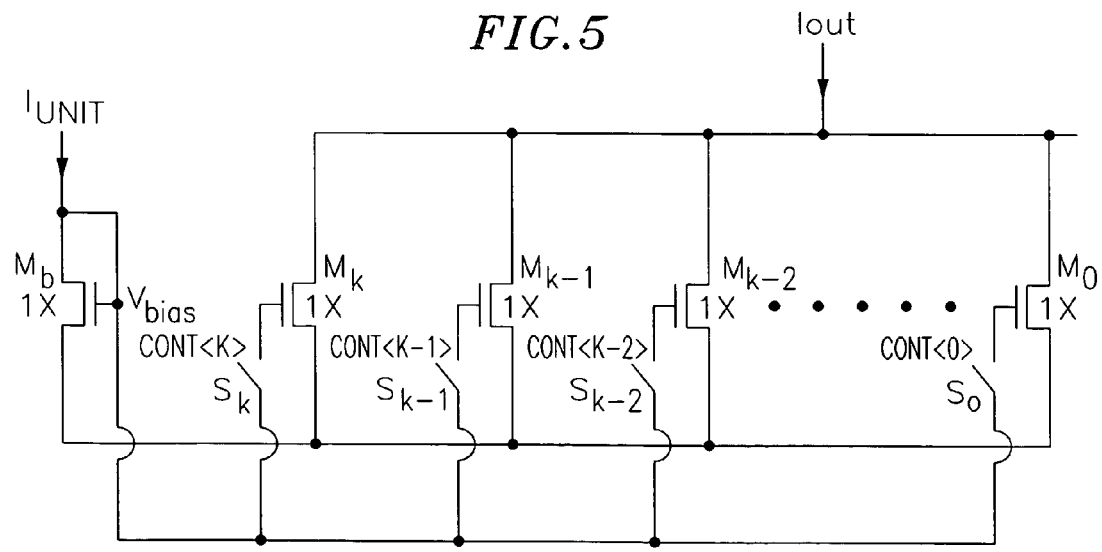
FIG. 5 is an exemplary circuit diagram of a current steering DAC, according to one embodiment of the present invention.

FIG. 5 is an exemplary circuit diagram of a current steering DAC, according to one embodiment of the present invention. As shown, transistor $M_b$ biased by a current $I_{unit}$ supplies a bias voltage $V_{bias}$. Each of the transistors $M_0$ to $M_K$ are turned on by respective switches $S_0$ to $S_K$ that are driven by CONT<0> to CONT <K>, respectively. Depending on the digital code CONT<k:0>, current $I_{out}$ ($I_{threshold}$) varies from 0 to its maximum required value in linear and monotonic steps. The maximum $I_{threshold}$ value can be calculated as $(k+1)I_{unit}$. In addition, the linear step size is $I_{unit}$. The DAC is called a thermometer DAC in this case, because the current sources switch one-at-a-time only.

Referring back to FIG. 4, NMOS transistors Mp and Mn are used in their saturation regions to sink all of $I_{threshold}$ to either Outp or Outn. In other words, NMOS transistors Mp and Mn are used for polarity selection of threshold adjustment. If Mp is turned ON (saturation region), then Mn is turned OFF sending $I_{threshold}$ to Outn. Likewise, if Mn is turned ON (saturation region), then Mp is turned OFF sending $I_{threshold}$ to Outp. If $I_{threshold}$ is sunk into Outn, the DC voltage component of Outn decreases by the amount that corresponds to the voltage drop generated by $I_{threshold}$ on $R_{LOAD}$ 47a. That is, the selected current from the DAC induces a voltage drop across the loads, which in turn reduces the DC voltage component of Outn.

In the above embodiment, NMOS transistors Mp and Mn, as well as transistors in the DAC are all low voltage transistors. Furthermore, the power supply VDD is used above the reliability voltage limit of the low voltage transistors. Using low voltage transistors is preferred to obtain the maximum trans-conductance with minimum area and loading. Using a VDD above the reliability voltage limit is also preferred to achieve higher speed for circuit components such as drivers, flip-flops, etc. If the low voltage transistors are used with a VDD above their reliability voltage limit, a careful biasing and proper operation of the low voltage transistors should be taken into account in the design of the circuit. In other words, the design should ensure that the voltage drops across the terminals of every low voltage transistor be within their reliability voltage limit.

In operation, when Mp is turned ON, input voltage Vbp(ON) is pulled to a predetermined voltage level above the threshold voltage $V_{TH}$ of Mp, but lower than power supply VDD, to keep Mp in saturation region, even if $I_{threshold}$ goes to its maximum level. A saturation region of a NMOS transition occurs when VD>VG−$V_{TH}$ of the transistor. When operating in the saturation region, a transistor has a high impedance between its source and drain. This high impedance decouples the output capacitance of the DAC from the $R_{load}$. If Vbp(ON) was selected as high as VDD, then Mp would go into triode region where not only its drain capacitance increases, but also, the DAC output capacitance would be added to the Outn node. Increased drain capacitance due to Mp entering into triode region would decrease the bandwidth at node Outn. In one embodiment, the input voltages Vbp and Vbn are digitally controlled.

Likewise, when Mn is turned ON, input voltage Vbn(ON) is pulled to a predetermined voltage level, lower than power supply VDD to keep Mn in saturation region, even if $I_{threshold}$ goes to its maximum level. Similar to Vbp(ON), if Vbn(ON) was selected as high as VDD, then Mn would go into triode region where its drain capacitance increases significantly. Again, increased drain capacitance due to Mn entering into triode region would decrease the bandwidth at node Outp. In one embodiment, the predetermined voltage level of the input voltage Vbp(ON)/Vbn(ON) is generated using a resistor voltage divider (not shown) to limit the Vbp(ON)/Vbn(ON) voltage to a voltage lower than VDD, so that Mp/Mn operate in their saturation regions and stay within their reliability limits. Similarly, the predetermined voltage level of the input voltages Vbp(OFF)/Vbn(OFF) is generated using a resistor divider (not shown) to limit the Vbp(OFF)/Vbn(OFF) to a voltage higher than GND, so that Mp/Mn operate in their OFF regions and stay within their reliability limits.

Further, bulk nodes of Mp and Mn are tied to a common source node $V_{SOURCE}$ to prevent drain-to-bulk voltage (VDB) from going above the reliability voltage limit. Likewise, when the bulk node is tied to source node the bulk-to-source voltage (VBS) becomes zero. Thus, the body effect on threshold voltage $V_{TH}$ of the transistor, which is a function of VBS, is also eliminated. This decreases the gate-to-source voltage (VGS) of the respective transistor for a given current density. Since VGS is reduced, this results in relaxing the headroom requirement of DAC transistors.

When Mp is turned OFF, Vbp(OFF) is pulled to a predetermined voltage level below the threshold voltage $V_{TH}$ of Mp, but higher than ground voltage (GND) to keep drain-to-gate voltage (VDG) of Mp below the reliability voltage limit. Similarly, when Mn is turned OFF, Vbn(OFF) is pulled to a predetermined voltage level below the threshold voltage $V_{TH}$ of Mn, but higher than GND to keep VDG voltage of Mn below the reliability voltage limit. However, if Vbn (OFF) is selected too low, such as GND, VDG of Mp and Mn would increase above its limit, which could cause reliability issues for Mp and Mn.

When the threshold adjustment circuit is disabled, the DC component voltage levels of Outp and Outn do not need to be adjusted. In one embodiment, both Mp and Mn are turned on resulting in sinking a small amount of current such as, but not limited to, $I_{unit}$ into Mp and Mn. However, keeping Mp and Mn both ON will have some disadvantages. Due to mismatch between Mp and Mn, $I_{threshold}$ will not be evenly sunk into Outp and Outn, which can cause a leaky and undesired threshold adjustment. Depending on the amount of current left sinking, DC component voltage levels of both Outp and Outn will go down and thus decrease the headroom for GM (DAC) stage. Moreover, if both Mp and Mn are left ON (in their saturation regions), then Rds(Mp)+Rds(Mn) decrease the output impedance $R_{LOAD}$ resulting in a decrease in the gain.

In one embodiment, when the threshold adjustment circuit is disabled, both Mp and Mn are turned off and another current passage path is created by switching on the transistor $M_{shut}$. The reason for creating another current passage path is to keep the common source node voltage $V_{SOURCE}$ of Mp and Mn above a certain level so that the drain-to-source voltage (VDS) of Mp and Mn can be kept within the reliability voltage limit. Thus, a small amount of current such as, $I_{unit}$ is left sinking into $M_{shut}$ to keep $V_{SOURCE}$ above a certain level. Since $M_{shut}$ is not in the critical signal path, a high voltage transistor for $M_{shut}$ is used such that it does not require any special biasing for $M_{shut}$, since VDD is within the reliability voltage limit of the high voltage transistor $M_{shut}$.

Figure 6:
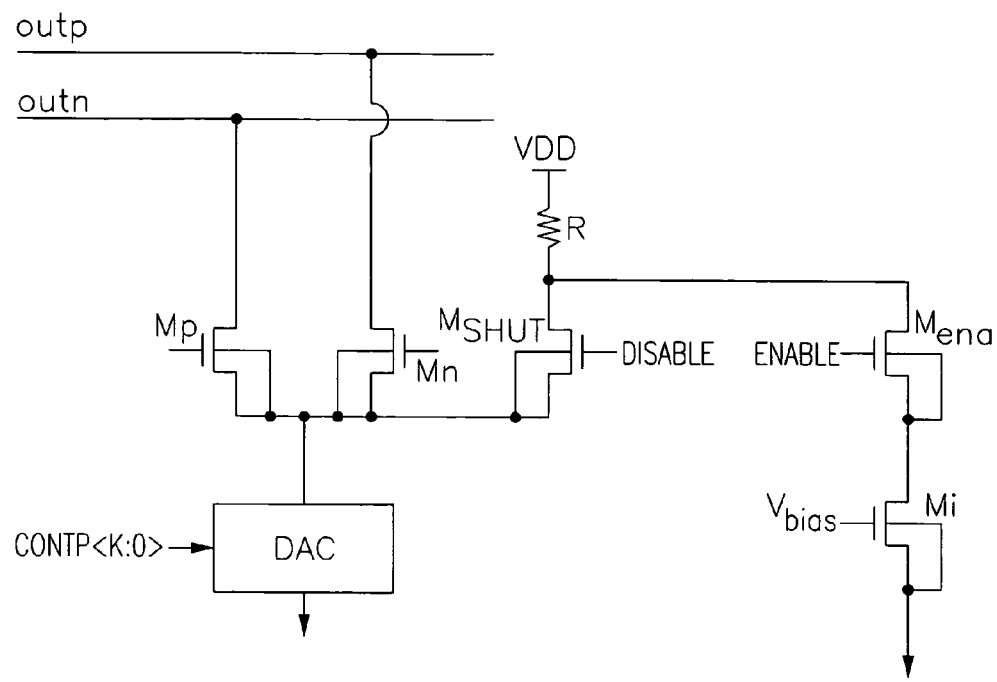
FIG. 6 is an exemplary circuit diagram of an alternative implementation of disabling scheme of a threshold adjuster for increasing and decreasing DC component voltages, according to one embodiment of the present invention.

If high voltage transistors are not available in the process and/or $M_{shut}$ should also be protected against over the limit terminal voltages, an alternative implementation of disabling scheme is illustrated in FIG. 6. Resistor R is used to limit the VDS voltage of $M_{shut}$. In addition, the gate voltages of $M_{shut}$, DISABLE and ENABLE voltages, have predetermined values to avoid any over the limit terminal voltages for $M_{shut}$ and $M_{ena}$ whether they are turned ON or OFF. One or more NMOS or PMOS transistors can be utilized to implement resistor R. Transistor Mi that is biased by $V_{BIAS}$ operates as a current source.

Although the threshold adjustment circuit is described using NMOS transistors only, those skilled in the art understand that the threshold adjustment circuit can be implemented using only PMOS transistors or using both NMOS and PMOS transistors.

Figure 1A:
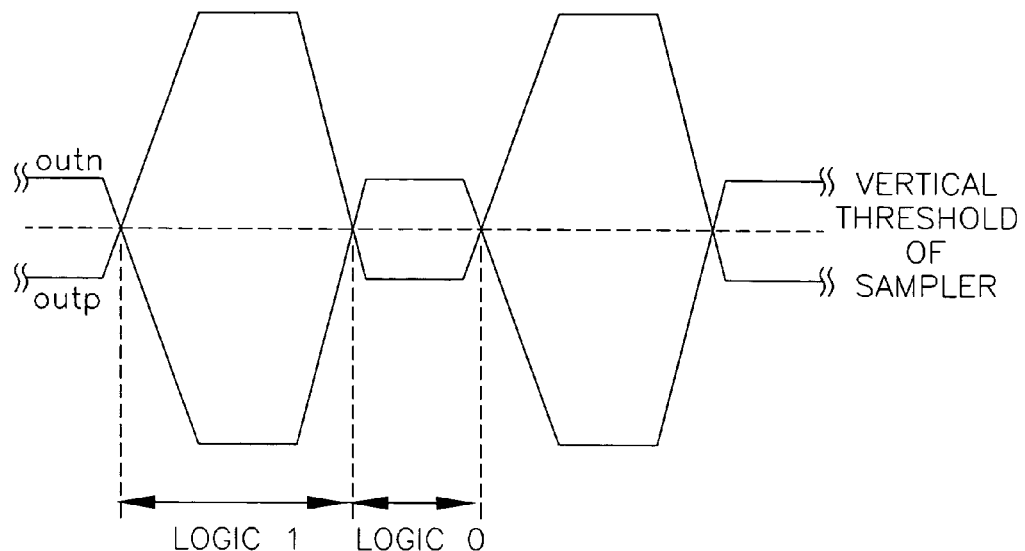
FIG. 1A is a timing diagram of a differential asymmetric incoming signal, before threshold adjustment.
Figure 1B:
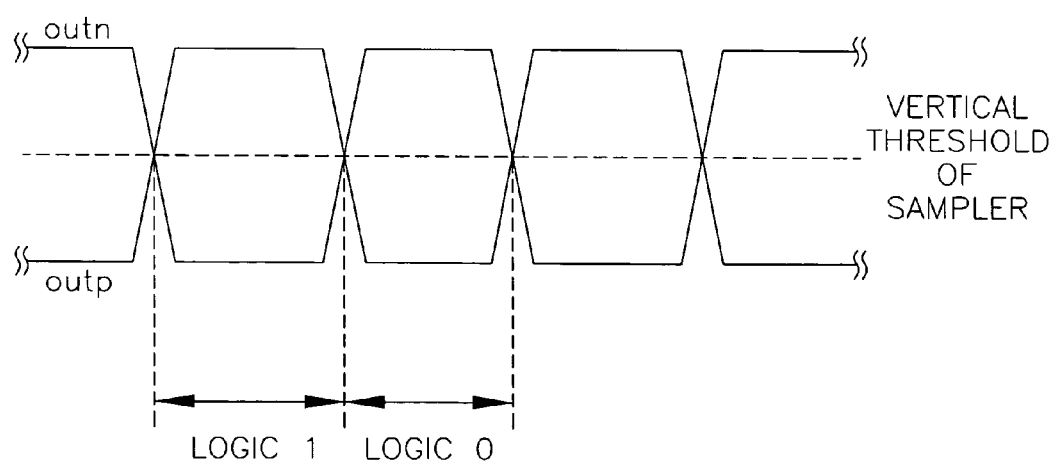
FIG. 1B is a timing diagram of a differential asymmetric incoming signal, after threshold adjustment.
Figure 2:
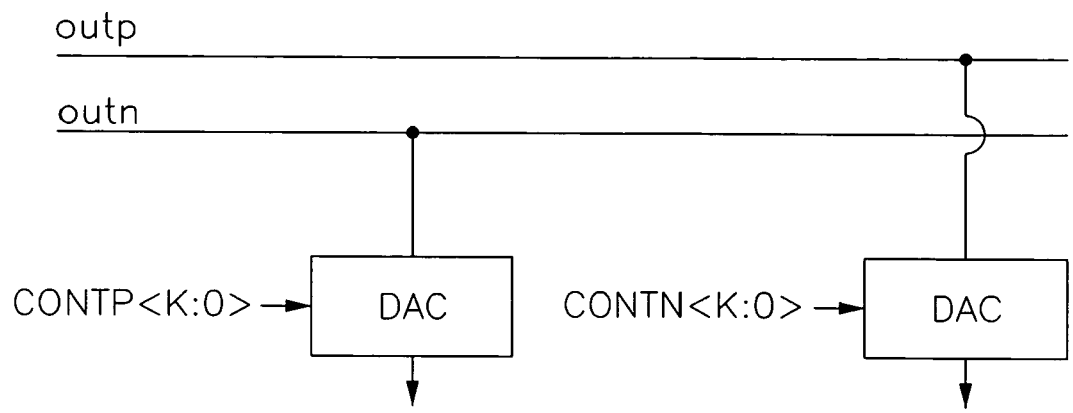
FIG. 2 is a conventional threshold adjustment circuit.
Figure 3:
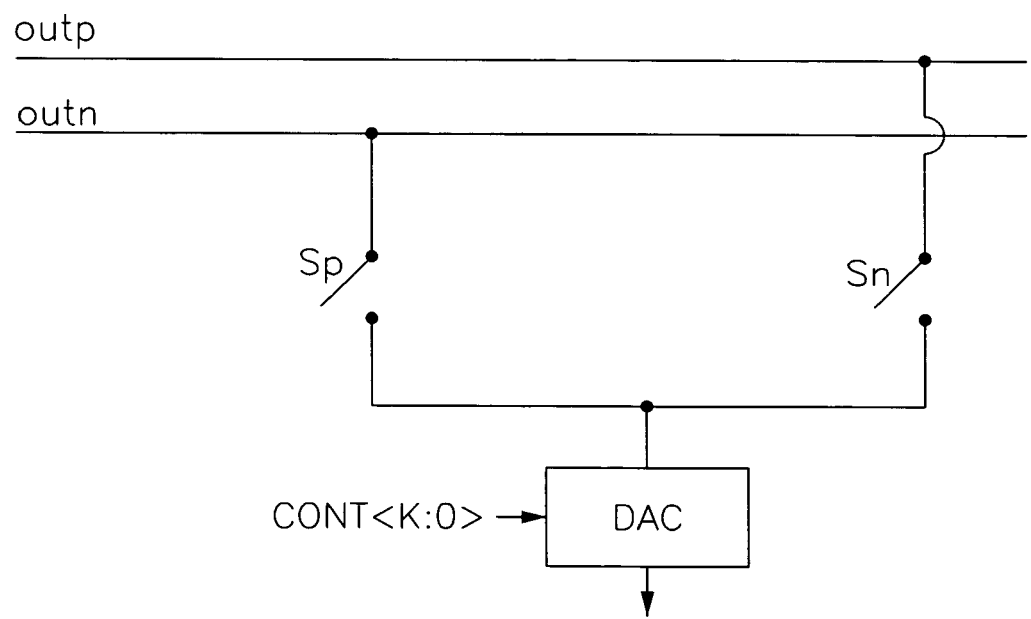
FIG. 3 is another conventional threshold adjustment circuit.
Figure 7:
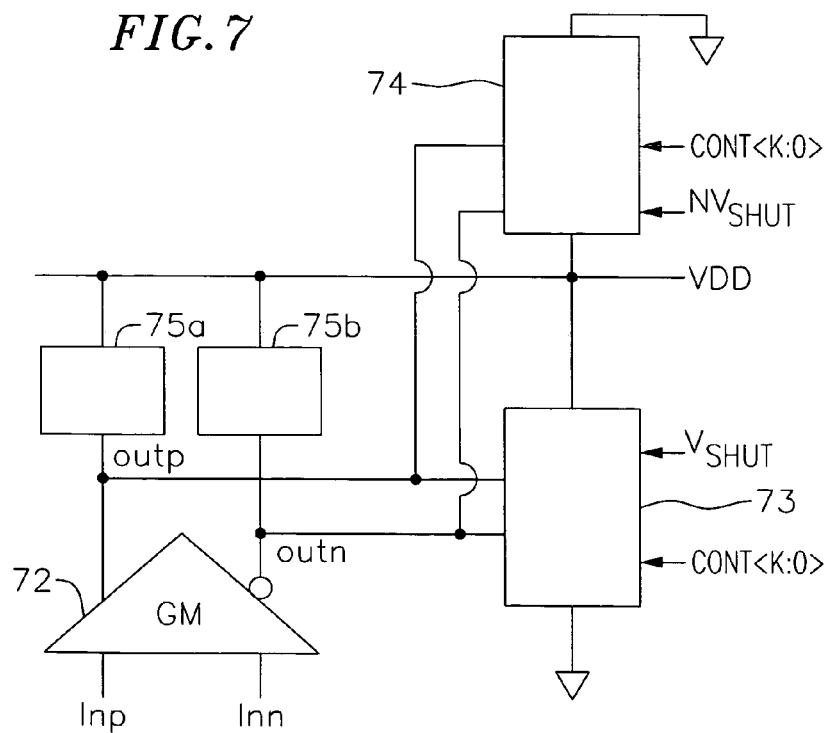
FIG. 7 is an exemplary circuit diagram of a threshold adjuster, according to one embodiment of the present invention.

The threshold adjustment circuit of FIG. 4 is utilized to decrease the DC voltage components of Outn or Outp. FIG. 7 is an exemplary circuit diagram of a threshold adjustment circuit that decreases the DC voltage components of Outn and Outp and increases the DC voltage components of Outn and Outp, resulting in a more uniform signal, as shown in FIG. 1B.

As illustrated in FIG. 7, a first threshold adjustment circuit 73 operates similar to the threshold adjustment circuit described in FIG. 4 to decrease and/or increase the DC voltage components of GM 72 outputs, Outn and Outp. A second threshold adjustment circuit 74 operates in a complementary way to the threshold adjustment circuit 73 to increase and/or decrease the DC voltage components of Outn and Outp also. A signal $NV_{shut}$ which may be the inverted signal $V_{shut}$ is used to shut the second threshold adjustment circuit 74. Each of the threshold adjustment circuits 73 and 74 include a DAC that is controlled by control signals CONT <k:0>. The control signals CONT <k:0> to each of the threshold adjustment circuits 73 and 74 may be the same or different, depending on the amount of current requirements to reduce the asymmetric eye opening, shown in FIG. 1A. In one embodiment there is only one DAC that is supplying/sinking current to each of the threshold adjustment circuits 73 and 74. Load resistors 75a and 75b are similar to those load resistors of FIG. 4. An exemplary embodiment of the threshold adjustment circuit 74 is shown in FIG. 8.

Figure 8:
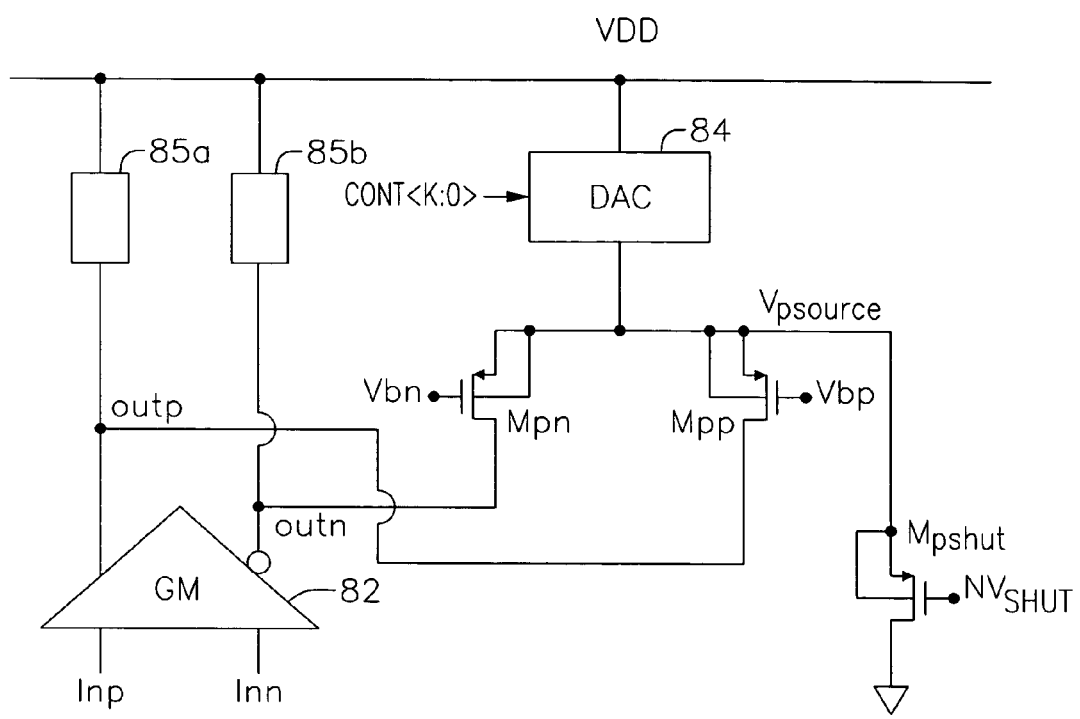
FIG. 8 is an exemplary circuit diagram of a threshold adjuster for increasing DC component voltages, according to one embodiment of the present invention.

FIG. 8 is an exemplary circuit diagram of a threshold adjustment circuit for increasing DC voltage components, according to one embodiment of the present invention. The circuit is similar to the threshold adjustment circuit of FIG. 4 in operation, however, it uses PMOS transistors, instead of NMOS transistors and supplies a current $I_{threshold}$, rather than sinking the current, to the loads.

The threshold adjustment circuit is coupled to Outp and Outn at the output of a GM 82 sourcing current from load impedances ($R_{LOAD}$) 85a and 85b. DAC 84 generates a threshold current 86 ($I_{threshold}$). Again, depending on the digital code CONT<k:0>, current $I_{threshold}$ varies from 0 to its maximum required value in linear and monotonic steps.

PMOS transistors Mpp and Mpn driven by inputs Vbn and Vbp are used in their saturation regions to send all of $I_{threshold}$ to either Outp or Outn. If Mpp is turned ON (saturation region), then Mpn is turned OFF sending $I_{threshold}$ to Outp. Likewise, if Mpn is turned ON (saturation region), then Mpp is turned OFF sending $I_{threshold}$ to Outn. If $I_{threshold}$ is supplied into Outn, DC voltage components of Outn increases by the amount that corresponds to the voltage drop generated by $I_{threshold}$ on $R_{LOAD}$ 85b. In the above embodiment, PMOS transistors Mpp and Mpn, as well as transistors in the DAC are all low voltage transistors. However, $M_{pshut}$ transistor may be a thick oxide transistor. If high voltage transistors are not available in the process and/or $M_{pshut}$ should also be protected against over the limit terminal voltages, the alternative implementation of disabling scheme of FIG. 6, that is, using a resistor R to limit the VDS voltage of $M_{pshut}$ may be used.

Control signal $NV_{shut}$ is used to disable the threshold adjustment circuit by turning the PMOS transistor $M_{pshut}$ ON while both Mpn and Mpp are OFF. Also, the bulks of Mpp and Mpn are connected to the common source node $V_{psource}$ and Vbp and Vbn voltages are set properly for turning Mpp and Mpn ON/OFF to avoid any voltage drop across the terminals of Mpp and Mpn rising below the reliability limit.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed.

What is claimed is:

1. A threshold adjustment circuit comprising:
    a current digital-to-analog converter (DAC) for supplying or sinking a varying current;
    a differential pair of thin oxide transistors coupled to the DAC and coupled together at a common source node;
    a supply voltage having a voltage level above reliability of the pair of thin oxide transistors; and
    a third transistor for maintaining voltage of the common source node above a first predetermined level and to disable the threshold adjustment circuit, wherein
    the bulk and source of each of the differential pair of thin oxide transistors is coupled to the common source node and each of the differential pair of thin oxide transistors is switched by a signal having an ON voltage level so that one of the thin oxide transistors is in saturation region and having an OFF voltage level so that the other thin oxide transistors is OFF but within its reliability limit.

2. The circuit of claim 1, wherein the differential pair of thin oxide transistors and the third transistor are NMOS transistors.

3. The circuit of claim 1, wherein the differential pair of thin oxide transistors are used for polarity selection of threshold adjustment.

4. The circuit of claim 1, wherein the differential pair of thin oxide transistors and the third transistor are PMOS transistors.

5. The circuit of claim 1, further comprising a differential load and a differential gain stage at a differential output of the threshold adjustment circuit.

6. The circuit of claim 5, wherein the DAC lowers DC components of one side of the differential output by increasing current through one side of the differential load.

7. The circuit of claim 1, wherein the DAC is a thermometer coded current steering DAC.

8. The circuit of claim 1, wherein the DAC is controlled by a plurality of control signals for incrementally increasing and decreasing the sourcing or sinking current.

9. The circuit of claim 1, wherein the third transistor is a thick oxide transistor.

10. The circuit of claim 1, further comprising a fourth transistor coupled to a drain of the third transistor at its drain, coupled to a current source at its source, and enabled by an enabling signal at its gate.

11. The circuit of claim 1, further comprising
a second current DAC for sinking or supplying a second varying current;
a second differential pair including a fourth thin oxide transistor and a fifth thin oxide transistor coupled to the second DAC and coupled together at a second common source node; and
a sixth transistor for maintaining voltage of the second common source node below a second predetermined level and to disable the second differential pair, wherein
the bulk and source of each of the fourth and fifth thin oxide transistors is coupled to the second common source node.

12. The circuit of claim 11, wherein the fourth, fifth, and sixth transistors are PMOS transistors.

13. The circuit of claim 11, wherein the second DAC is a thermometer coded current steering DAC.

14. The circuit of claim 11, wherein the sixth transistor is a thick oxide transistor.

* * * * *